(12) United States Patent
Kim

(10) Patent No.: US 7,782,081 B2
(45) Date of Patent: *Aug. 24, 2010

(54) CIRCUIT FOR CONTROLLING DRIVER OF SEMICONDUCTOR MEMORY APPARATUS AND METHOD OF CONTROLLING THE SAME

(75) Inventor: Kyung-Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/364,656

(22) Filed: Feb. 3, 2009

(65) Prior Publication Data

US 2009/0146684 A1    Jun. 11, 2009

Related U.S. Application Data

(63) Continuation of application No. 11/641,856, filed on Dec. 20, 2006, now Pat. No. 7,489,159.

(30) Foreign Application Priority Data

Feb. 7, 2006   (KR) ............... 10-2006-0011594
Apr. 6, 2006   (KR) ............... 10-2006-0031618

(51) Int. Cl.
   *H03K 19/003* (2006.01)
(52) U.S. Cl. .................. 326/30; 326/86; 327/108
(58) Field of Classification Search ............ 326/30, 326/86; 327/108
   See application file for complete search history.

(56) References Cited

U.S. PATENT DOCUMENTS

| 6,396,329 B1 | 5/2002 | Zerbe |
| 6,990,030 B2 | 1/2006 | Lemus et al. |
| 2003/0146774 A1 | 8/2003 | Coughlin et al. |
| 2005/0040845 A1* | 2/2005 | Park ........................ 326/30 |
| 2005/0052200 A1* | 3/2005 | Nguyen et al. ............ 326/30 |
| 2005/0134307 A1* | 6/2005 | Stojanovic et al. ........ 326/31 |

FOREIGN PATENT DOCUMENTS

| CN | 1167987 | 12/1997 |
| CN | 1372268 | 10/2002 |
| JP | 9130229 | 5/1997 |
| KR | 1020000002393 A | 1/2000 |
| KR | 1020000038594 A | 7/2000 |
| KR | 1020050028076 A | 3/2005 |
| KR | 102005010796A A | 11/2005 |

* cited by examiner

*Primary Examiner*—Vibol Tan
(74) *Attorney, Agent, or Firm*—Venable LLP; Jeffri A. Kaminski

(57) ABSTRACT

A circuit for controlling a driver of a semiconductor memory apparatus includes a driving unit having an impedance that is set according to a code value; a driving reinforcing control unit configured to output an adjustment code for a predetermined time; and a driving reinforcing unit configured to output a reinforcing code obtained by adjusting the code value using the adjustment code, wherein the reinforcing code reinforce a driving capability of the driving unit.

10 Claims, 5 Drawing Sheets

CIRCUIT FOR CONTROLLING DRIVER OF SEMICONDUCTOR MEMORY APPARATUS AND METHOD OF CONTROLLING THE SAME

CROSS-REFERENCE TO RELATED APPLICATIONS

This application is a continuation of U.S. patent application Ser. No. 11/641,856, filed Dec. 20, 2006, the subject matter of which application is incorporated herein by reference in its entirety.

This U.S. non-provisional patent application claims priority under 35 U.S.C. §119 of Korean Patent Application No. 2006-031618 filed on Apr. 6, 2006, the entire contents of which are hereby incorporated by reference.

BACKGROUND OF THE INVENTION

1. Technical Field

The present invention relates to a semiconductor memory apparatus, and more particularly, to a circuit for controlling a driver of a semiconductor memory apparatus.

2. Related Art

Generally, a semiconductor memory apparatus includes a plurality of drivers with different impedance values so as to correspond to various data input and output impedances, and the plurality of drivers can selectively operated so as to implement various input and output impedances.

Further, a semiconductor memory apparatus has a pre-emphasis function for lowering the impedance at the time of driving transited data, so as to improve the driving capability. Therefore, the semiconductor memory apparatus needs a separate driver to achieve the pre-emphasis function.

A circuit for controlling a driver of a semiconductor memory apparatus according to the related art is described below.

Ask shown in FIG. 1, the circuit for controlling a driver of a semiconductor memory apparatus according to the related art includes first to third drivers 40, 70 and 100; an impedance adjusting unit 10 that outputs a first code PC<0:5> and a second code NC<0:5> for adjusting the impedance value of each of the first to third drivers 40, 70 and 100 to a set value; driver control units 20, 50 and 80, each of which outputs the first code PC<0:5> and the second code NC<0:5> according to a driver enable signal stinf<0:2>; data processing units 30, 60 and 90 that output data (UP: pull-up data, and DN: pull-down data) to the corresponding first to third drivers 40, 70 and 100 according to the first code PC<0:5> and the second code NC<0:5>; an auxiliary driver 120 that reinforces the driving capabilities of the first to third drivers 40, 70 and 100 according to input auxiliary codes; an auxiliary code processing unit 110 that outputs the auxiliary code to the auxiliary driver 120 according to a driving reinforcing enable signal PE; and a pad 130 that is connected in common to output terminals of the first to third drivers 40, 70 and 100 and the auxiliary driver 120 and outputs data to an external device.

Each of the first to third drivers 40, 70 and 100, and the auxiliary driver 120 includes a pull-up driver having a plurality of PMOS transistors and a pull-down driver having a plurality of NMOS transistors. In each of the plurality of PMOS transistors, the source is connected in common to a power supply terminal VDDQ, and the drain is connected to a resistor. In each of the plurality of NMOS transistors, the drain is connected in common to a ground terminal, and the source is connected to a resistor. The number of drivers depends on the circuit design, and FIG. 1 shows an exemplary circuit using three drivers and one auxiliary driver.

The operation of the circuit apparatus for controlling a driver of a semiconductor memory apparatus according to the related art with the above-described structure is herein described.

The impedance adjusting unit 10 outputs a first code PC<0:5> and a second code NC<0:5> for adjusting the impedance of each driver, such that the impedance value of each driver is matched with a prescribed value.

The driver control units 20, 50 and 80 output the first code PC<0:5> and the second code NC<0:5> to the corresponding data processing units 30, 60 and 90, or intercept them according to the driver enable signals stinf<0:2>. For example, when the signal stinf<0> is enabled at a logic high level, the driver control unit 20 outputs the first code PC<0:5> and the second code NC<0:5> to the data processing unit 30, but when the signal stinf<0> is disabled at a logic low level, the driver control unit 20 does not output the first code PC<0:5> and the second code NC<0:5> to the data processing unit 30.

The data processing units 30, 60 and 90 output the pull-up data UP to the first to third drivers 40, 70 and 100 according to the first code PC<0:5>, and output the pull-down data DN to the corresponding first to third drivers 40, 70 and 100 according to the second code NC<0:5>.

Accordingly, the first to third drivers 40, 70, and 100 drive the pull-up data UP and the pull-down data DN.

When a pre-emphasis function needs to be performed according to the data transition, the driving reinforcing enable signal PE becomes enabled and the auxiliary code processing unit 110 outputs the prescribed auxiliary code.

As a result, the auxiliary driver 120 reinforces the driving capability.

That is, the first to third drivers 40, 70 and 100 and the auxiliary driver 120 are connected to each other, and internal resistors thereof are connected in parallel to one another. Therefore, when the auxiliary driver 120 operates, the total impedance value of all of the drivers is reduced, thereby reinforcing the driving capability.

However, the circuit for controlling a driver of a semiconductor memory apparatus according to the related art has the following problems.

First, since capacitance exists in each driver due to a connection node between a transistor and a resistor, as the number of drivers increases, the capacitance increases, which deteriorates the impedance characteristics.

Second, since a separate driver is necessary for the pre-emphasis function, the larger layout area is necessary.

SUMMARY OF THE INVENTION

Embodiments of the present invention provide a circuit for controlling a driver of a semiconductor memory apparatus, in which impedance characteristics may be improved and layout area may be reduced.

An embodiment of the present invention provides a circuit for controlling the driver of a semiconductor memory apparatus. The apparatus for controlling the driver of a semiconductor memory apparatus may include a driving unit having an impedance that is set according to a code value; a driving reinforcing control unit configured to output an adjustment code for a predetermined time; and a driving reinforcing unit configured to output a reinforcing code obtained by adjusting the code value using the adjustment code, wherein the reinforcing code reinforce a driving capability of the driving unit.

DESCRIPTION OF EXEMPLARY EMBODIMENTS

Embodiments of an apparatus for controlling a driver of a semiconductor memory apparatus will now be described with reference to the accompanying drawings.

Figure 2:
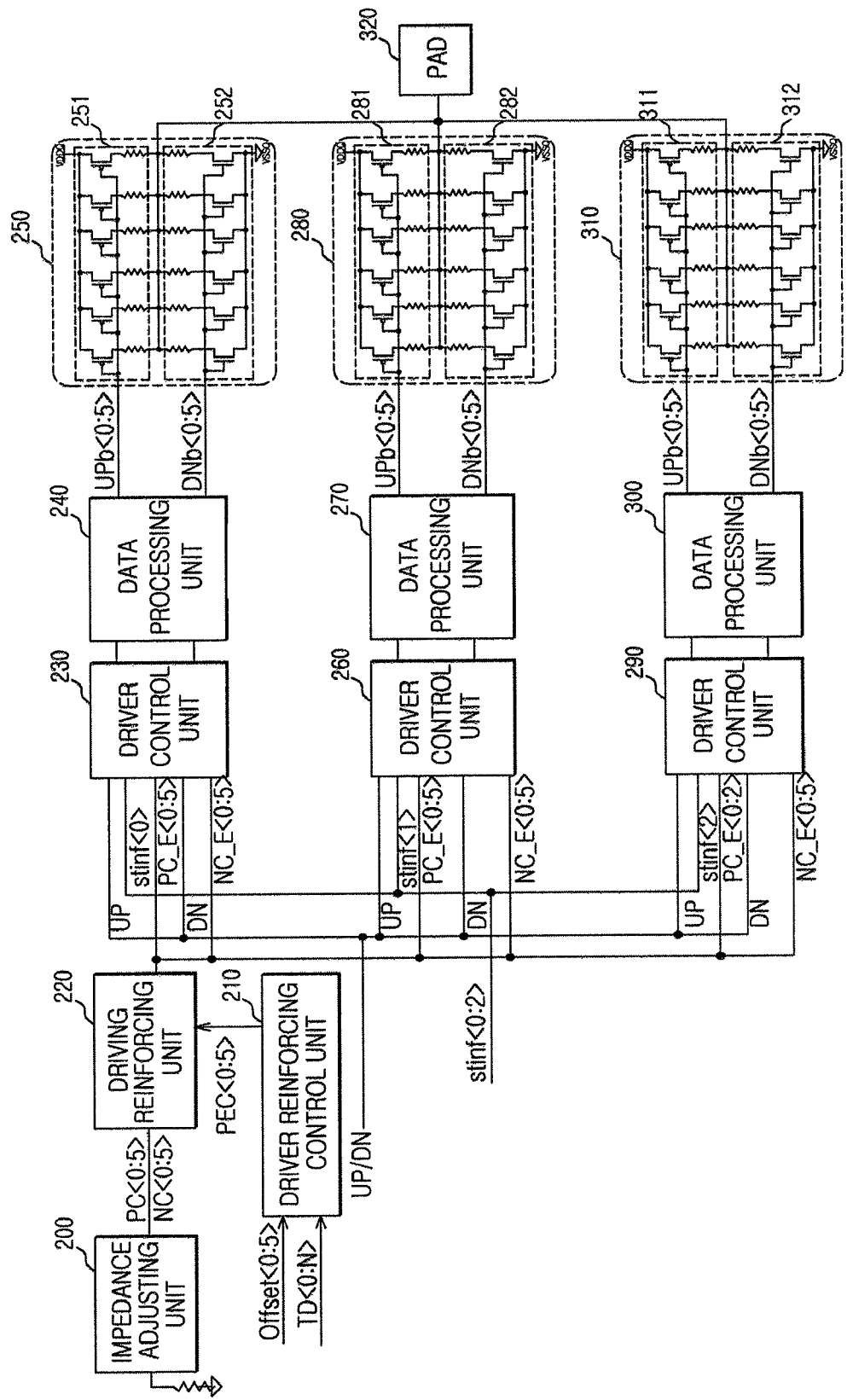
FIG. 2 is a block diagram illustrating the structure of a circuit for controlling a driver of a semiconductor memory apparatus according to an embodiment of the present invention.

FIG. 2 is a block diagram illustrating the structure of a circuit for controlling a driver of a semiconductor memory apparatus according to an embodiment of the present invention. The circuit for controlling a driver of a semiconductor memory apparatus according to an embodiment of the present invention may be constructed such that a pre-emphasis function can be performed without a separate driver.

As shown in FIG. 2, the circuit for controlling a driver of a semiconductor memory apparatus according to the embodiment of the present invention may include a plurality of drivers 250, 280 and 310; an impedance adjusting unit 200 that outputs a first code PC<0:5> and a second code NC<0:5> for adjusting the impedance value of each of the plurality of drivers 250, 280 and 310 to a set value; a driving reinforcing control unit 210 that outputs an adjustment code PEC<0:5> according to offset data offset<0:5> for a predetermined time corresponding to timing data TD<0:N>; a driving reinforcing unit 220 that outputs a first reinforcing code PC_E<0:5> and a second reinforcing code NC_E<0:5> obtained by adjusting a value of the first code PC<0:5> and a value of the second code NC<0:5> using the adjustment code PEC<0:5>, so as to reinforce the driving capabilities of the plurality of drivers 250, 280 and 310; a plurality of driver control units 230, 260 and 290, each of which outputs the first reinforcing code PC_E<0:5> and the second reinforcing code NC_E<0:5> according to a driver enable signal stinf<0:2>; a plurality of data processing units 240, 270 and 300 that output data (UP: pull-up data, and DN: pull-down data) to the plurality of corresponding drivers 250, 280 and 310 according to the first reinforcing code PC_E<0:5> and the second reinforcing code NC_E<0:5>; and a pad 320 that is coupled in common to output terminals of the plurality of drivers 250, 280 and 310 and outputs data to an external device.

Since the plurality of drivers 250, 280 and 310 may have the same internal structure, only the structure of the driver 250 will be described. The driver 250 may include a pull-up driver 251 having a plurality of PMOS transistors and a pull-down driver 252 having a plurality of NMOS transistors. Here, in each of the plurality of PMOS transistors, the source is coupled in common to a power supply terminal VDDQ and the drain is coupled to a resistor. In each of the plurality of NMOS transistors, the source is coupled in common to a ground terminal and the drain is coupled to a data pull-down resistor. The number of drivers depends on the circuit design, and FIG. 2 shows an exemplary embodiment using three drivers. Further, the number of transistors and resistors forming each driver is not fixed. According to the structure shown in FIG. 2, each of the pull-up driver 251 and the pull-down driver 252 has six transistors and six resistors. Of course, other numbers of drivers, transistors and resistors may be used.

The impedance values of the drivers 250, 280 and 310 may be different from desired values according to element characteristics and environmental factors. Accordingly, an impedance value may be matched with the desired value by adjusting the number of coupled resistors through code input and selectively turning on transistors in the driver. As shown in FIG. 2, when each of the pull-up driver 251 and the pull-down driver 252 has six transistors, both the first code and the second code have six bits.

Figure 3:
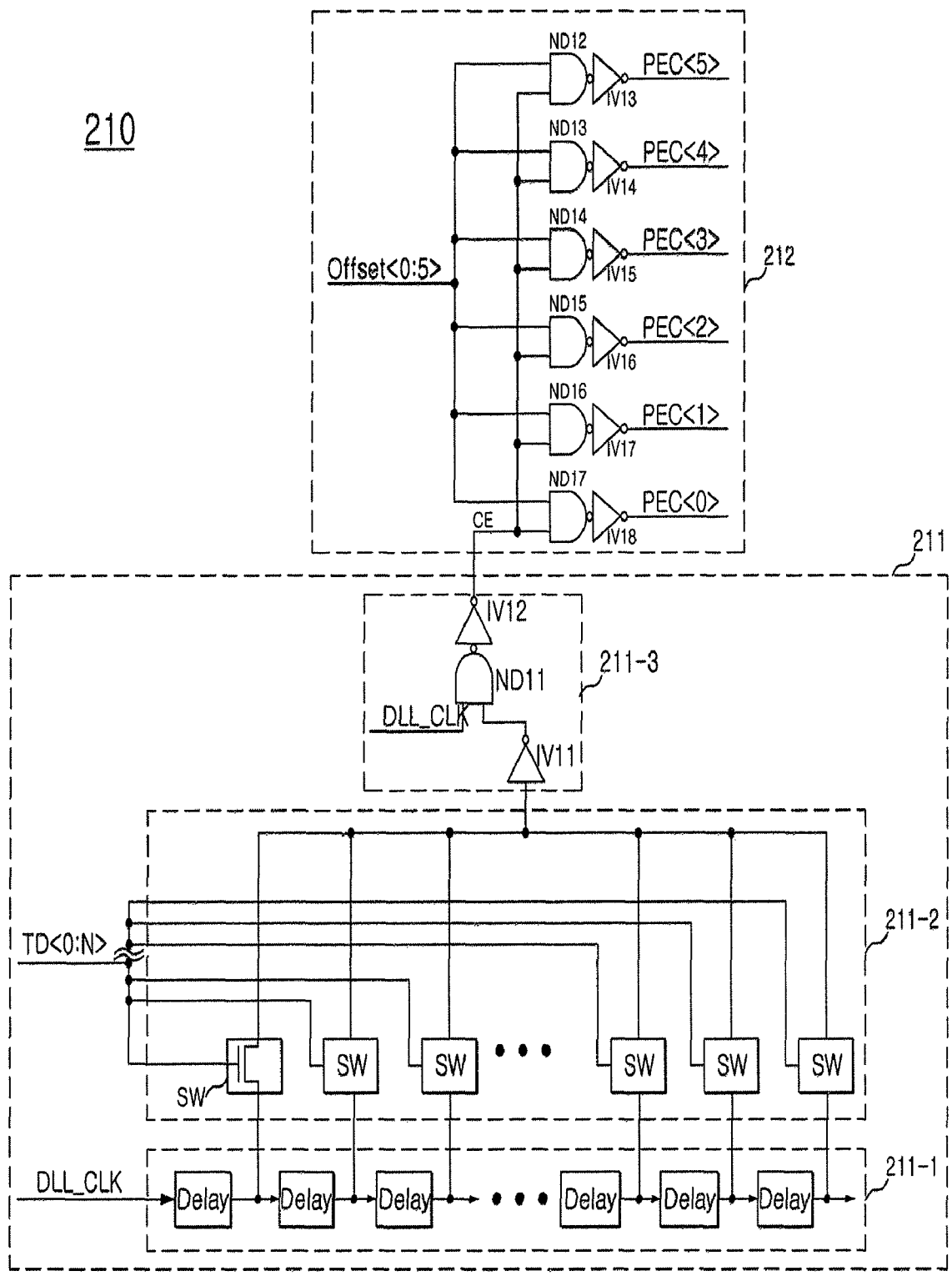
FIG. 3 is a circuit diagram illustrating the internal structure of a driving reinforcing control unit of FIG. 2.

FIG. 3 is a circuit diagram illustrating the internal structure of a driving reinforcing control unit of FIG. 2. As shown in FIG. 3, the driving reinforcing control unit 210 may include a timing control unit 211 that enables a code output enable signal CE for a predetermined time set by timing data TD<0:N>, and an adjustment code output unit 212 that outputs an adjustment code PEC<0:5> according to offset data offset<0:5> at an enable time of the code output enable signal CE. The timing data TD<0:N> and offset data offset<0:5> are set in a mode register that sets various operational conditions of a semiconductor memory apparatus, and may be supplied at the time of operation. Values of the timing data TD<0:N> and offset data offset<0:5> may be reset or changed.

The timing control unit 211 may include a timing signal generator 211-1 that has a plurality of delay elements and generates timing signals obtained by delaying a DLL (Delay Locked Loop) clock DLL_CLK for a predetermined amount of time; a multiplexer 211-2 that has a plurality of switches SW that receive the timing signals outputted by the timing signal generator 211-1 and outputs one of the timing signals according to the timing data TD <0:N>; and a code output enable signal generator 211-3 that generates the code output enable signal CE using the timing signal outputted by the multiplexer 211-2. The code output enable signal generator 211-3 includes a first inverter IV11 that receives the output of the multiplexer 211-2, a first NAND gate ND11 that receives the output of the first inverter IV11 and the DLL clock DLL_CLK, and a second inverter IV12 that receives the output of the first NAND gate ND11 and outputs the code output enable signal CE.

The adjustment code output unit 212 may include second to seventh NAND gates ND12 to ND17, each of which has a first input terminal receiving offset data offset<0:5> and a second input terminal receiving the code output enable signal CE, and third to eighth inverters IV13 to IV18 that receive the output of the respective second to seventh NAND gate ND12 to ND17 and output the adjustment codes PEC<0:5>, respectively.

Figure 4:
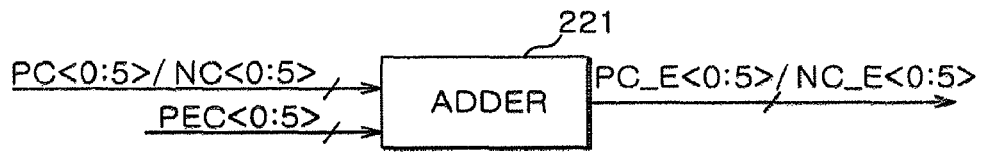
FIG. 4 is a circuit diagram illustrating the internal structure of a driving reinforcing unit of FIG. 2.

FIG. 4 is a circuit diagram illustrating the internal structure of a driving reinforcing unit of FIG. 2. As shown in FIG. 4, the driving reinforcing unit 220 may include an adder 221 that adds the adjustment code PEC<0:5> to the first code PC<0:5> and the second code NC<0:5> and outputs a first reinforcing code PC_E<0:5> and a second reinforcing code NC_EC<0:5>.

Figure 5:
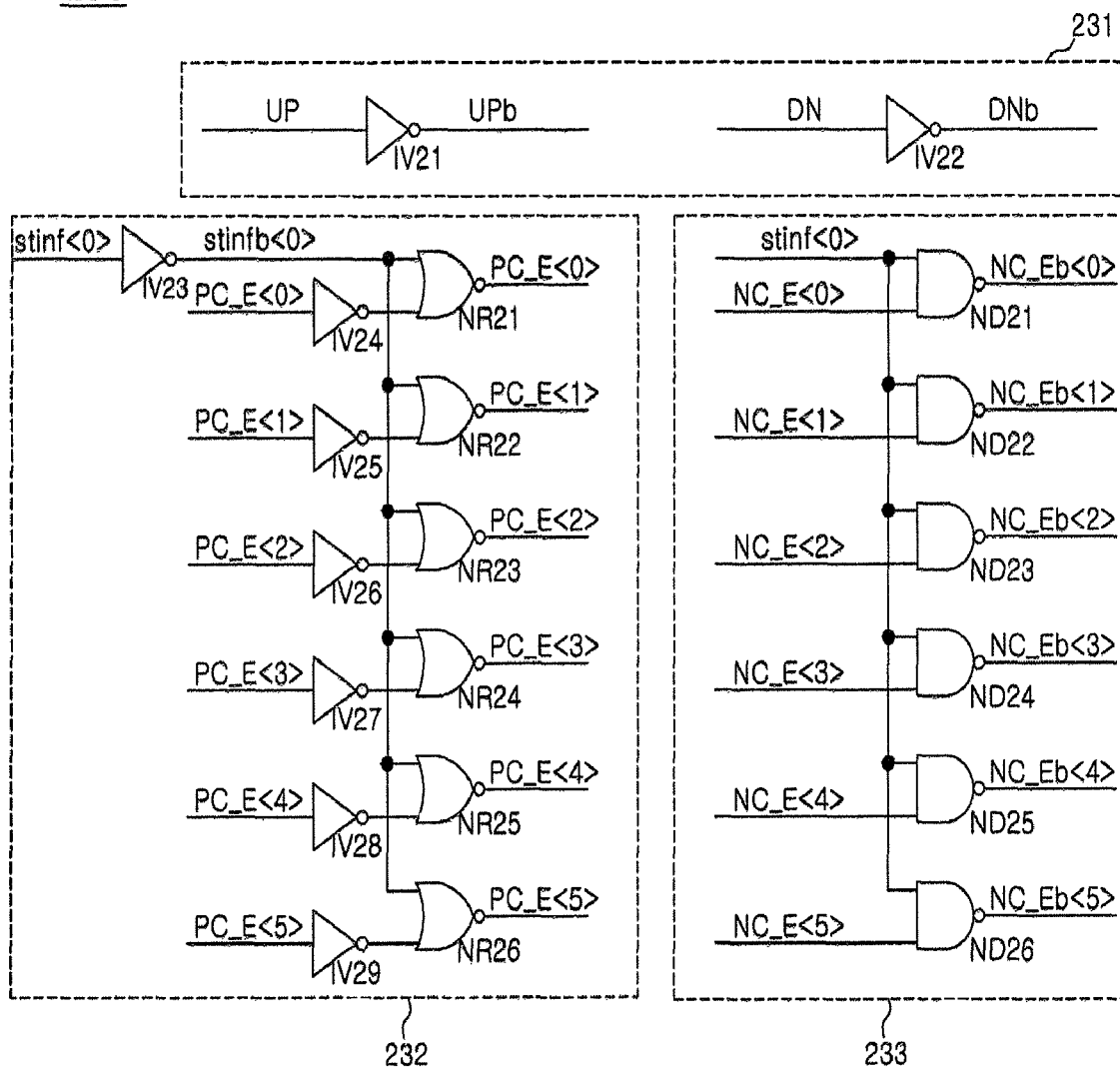
FIG. 5 is a circuit diagram illustrating the internal structure of a driver control unit of FIG. 2.

FIG. 5 is a circuit diagram illustrating the internal structure of a driver control unit of FIG. 2. As shown in FIG. 5, the driver control unit 230 may include a data converting unit 231 that converts data so as to enable pull-up and pull-down driving, a pull-up driver control unit 232 that determines whether or not to output the first reinforcing code PC_E<0:5> according to a driver enable signal stinf<0>, and a pull-down driver control unit 233 that determines whether or not to output the second reinforcing code NC_E<0:5> according to the driver enable signal stinf<0>. Each of the driver control units 260 and 290 has the same structure as the driver control unit 230.

The data converting unit 231 may include a first inverter IV21 that receives pull-up data UP and outputs inverted pull-up data Upb, and a second inverter IV22 that receives pull-down data DN and outputs inverted pull-down data DNb.

The pull-up driver control unit 232 may include a third inverter IV23 that receives a driver enable signal stinf<0> and outputs an inverted driver enable signal stinfb <0>; fourth to ninth inverters IV24 to IV 29 that receive the first reinforcing codes PC_E<0:5>, respectively; and first to sixth NOR gates NR21 to NR26, each of which has a first input terminal commonly inputted with the inverted driver enable signal stinfb<0> and a second input terminal receiving the output of the respective fourth to ninth inverter IV24 to IV29, which output the first reinforcing code PC_E<0:5>.

The pull-down driver control unit 233 may include first to sixth NAND gates ND21 to ND 26, each of which has a first input terminal commonly inputted with the driver enable signal stinfb<0>, and a second input terminal receiving a second reinforcing code NC_E<0:5>, which output an inverted second reinforcing code NC_Eb<0:5>.

Figure 6:
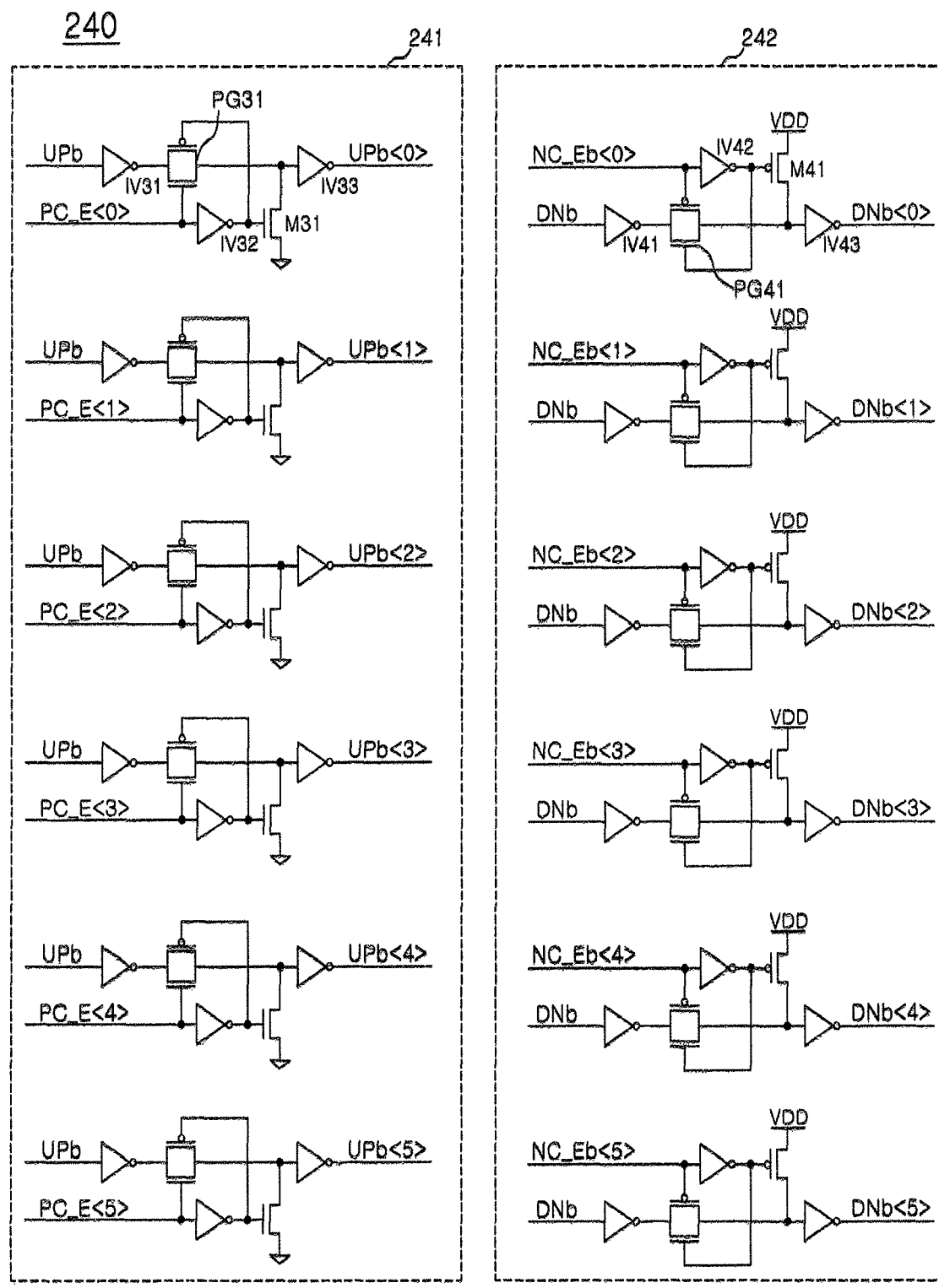
FIG. 6 is a circuit diagram illustrating the internal structure of a data processing unit of FIG. 2.

FIG. 6 is a circuit diagram illustrating the internal structure of a data processing unit of FIG. 2. As shown in FIG. 6, the data processing unit 240 may include a pull-up data processing unit 241 that outputs inverted pull-up data UPb to the driver 250 according to the first reinforcing code PC_E<0:5>, and a pull-down data processing unit 242 that outputs inverted pull-down data DNb to the driver 250 according to the inverted second reinforcing code NC_Eb<0:5>. Each of the data processing units 270 and 300 has the same structure as the data processing unit 240.

The pull-up data processing unit 241 includes logic circuits that determine whether or not to output the inverted pull-up data Upb with the same number of bits as the first reinforcing code PC_E<0:5>. Since all of the logic circuits have the same structure, the structure of a logic circuit that receives the first reinforcing code PC_E<0> will be described below. The logic circuit includes a first inverter IV31 that receives the inverted pull-up data Upb, a second inverter IV32 that receives the code PC_E<0>, a pass gate PG31 that has an input terminal receiving the output of the first inverter IV31, a first control terminal receiving the output of the second inverter IV32, and a second control terminal receiving the code PC_E<0>, a transistor M31 with its gate receiving the output of the second inverter IV32, its source coupled to the output terminal of the pass gate PG31, and its drain coupled to a ground, and a third inverter IV33 whose input terminal is coupled to the source of the transistor M31.

The pull-down data processing unit 242 may include logic circuits that determine whether or not to output the inverted pull-down data DNb with the same number of bits as the inverted second reinforcing code NC_Eb<0:5>. Since all of the logic circuits may have the same structure, the structure of a logic circuit that receives the code NC_Eb<0> is herein described. The logic circuit includes a first inverter IV41 that receives the inverted pull-down data DNb, a second inverter IV42 that receives the code NC_Eb<0>, a pass gate PG41 that has an input terminal receiving the output of the first inverter IV41, a first control terminal receiving the code NC_Eb<0>, and a second control terminal receiving the output of the second inverter IV42, a transistor M41 with its gate receiving the output of the second inverter IV42, its drain coupled to the output terminal of the pass gate PG41, and its source coupled to a power supply VDD, and a third inverter IV43 whose input terminal is coupled to the drain of the transistor M41.

Hereinafter, an exemplary operation of controlling the driver of a semiconductor memory apparatus according to an embodiment of the invention that has the above-described structure will be described.

First, the timing signal generator 211-1 in the timing control unit 211 of the driving reinforcing control unit 210 of FIG. 3 delays a DLL clock DLL_CLK through a plurality of delay elements Delay so as to generate a timing signal.

One of the plurality of switch SW included in the multiplexer 211-2 is turned on according to timing data TD<0:5>.

The timing signal that has passed through the switch SW of the multiplexer 211-2, having been turned on, is input to the code output enable signal generator 211-3.

The code output enable signal generator 211-3 synchronizes the output of the multiplexer 211-2 with the DLL clock DLL_CLK and output a code output enable signal CE having a predetermined enable period.

The adjustment code output unit 212 outputs the adjustment code PEC<0:5> during a period where the voltage level of the code output enable signal CE becomes enabled at a logic high level. The code value of the adjustment code PEC<0:5> is fixed to a low level during an period where the voltage level of the code output enable signal CE becomes disabled at a logic low level.

The adder 221 of the driving reinforcing unit 220 of FIG. 4 outputs the first reinforcing code PC_E<0:5> and the second reinforcing code NC_E<0:5>, which are respectively obtained by adding the adjustment code PEC<0:5> to the first code PC<0:5> and the second code NC<0:5> outputted by the impedance adjusting unit 210, to the plurality of driver control units 230, 260 and 290. Each of the first reinforcing code PC_E<0:5> and the second reinforcing code NC_E<0:5> is a code that adjusts the impedance of the drivers 250, 280 and 310 to the impedance necessary for driving reinforcement.

For example, if the first code PC<0:5> is "110000" and the first reinforcing code PC_E<0:5> is "110110", an adjustment code PEC is "000110".

The driver control unit 230 of FIG. 5 outputs the inverted pull-up data UPb and the inverted pull-down data DNb, which have been inverted by the data converting unit 231. When the stinf<0> is enabled at a logic high level, the pull-up driver control unit 232 outputs the first reinforcing code PC_E<0:5> to the data processing unit 240, and when the stinf<0> is enabled at a logic high level, the pull-down driver control unit 233 outputs the inverted second reinforcing code NC_Eb<0:5> to the data processing unit 240. The driver control units 260 and 290 also operate in the same manner as the driver control unit 230.

Then, when the first reinforcing code PC_E<0:5> is set to a logic high level, the pull-up data processing unit 241 of the data processing unit 240 of FIG. 6 outputs the inverted pull-up data <UPb0:5> to the driver 250. For example, when PC_E<0> is enabled at a logic high level, the pass gate PG31 is turned on. As a result, the inverted pull-up data UPb<0> is outputted to the driver 250. Further, when the inverted second reinforcing code NC_Eb<0:5> is set to a logic low level, the pull-down data processing unit 242 outputs the inverted pull-down data DNb<0:5> to the driver 250. For example, when the NC_Eb<0> becomes a low level (NC_E<0> becomes a high level), the pass gate PG41 is turned on. The inverted pull-down data DNb<0> is outputted to the driver 250. The data processing units 270 and 300 also operate in the same manner as the data processing unit 240.

The plurality of drivers 250, 280 and 310 drive the inverted pull-up data UPb<0> and the inverted pull-down data DNb<0:5> to output them through the pad 320. In each of the plurality of drivers 250, 280 and 310, the number of transistors that are turned on by the first reinforcing code PC_E<0:5> and the second reinforcing code NC_Eb<0:5> is increased and thus the number of coupled resistors is increased, reducing the total impedance. Therefore, as compared with a case in which the plurality of drivers 250, 280 and 310 receive the first code PC<0:5> and the second code NC<0:5>, a driving capability is reinforced.

Figure 1:
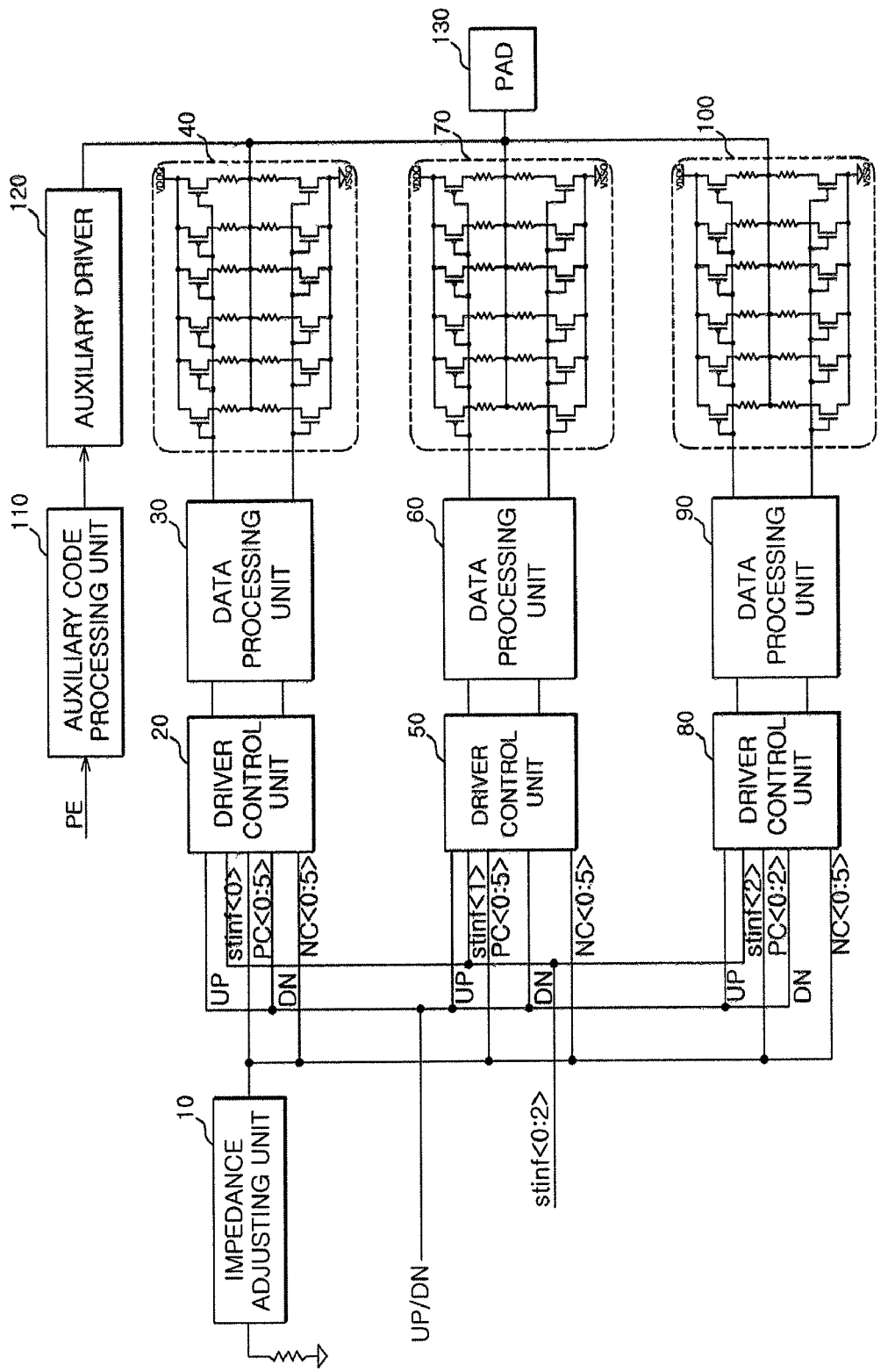
FIG. 1 is a block diagram illustrating the structure of a circuit for controlling a driver of a semiconductor memory apparatus according to the related art.

That is, according to the related art shown in FIG. 1, a pre-emphasis function is separately performed by the auxiliary driver 120, but according to an embodiment of the present invention, the pre-emphasis function can be performed by using the plurality of drivers 250, 280 and 310 shown in FIG. 2 without using a separate driver. When all of the adjustment codes PEC <0:5> are outputted to 0 by the driving reinforcing control unit 210, the plurality of drivers 250, 280 and 310 perform a data driving operation according to the first code PC<0:5> and the second code NC<0:5>.

It will be apparent to those skilled in the art that various modifications and changes may be made without departing from the scope and spirit of the present invention. Therefore, it should be understood that the above embodiments are not limiting, but illustrative in all aspects. The scope of the invention is defined by the appended claims rather than by the description preceding them, and therefore all changes and modifications that fall within the metes and bounds of the claims, or equivalents of such metes and bounds are therefore intended to be embraced by the claims.

The circuit for controlling a driver of a semiconductor memory apparatus and the method of controlling the same according to an embodiment of the present invention may have the following effects, because a driving capability can be reinforced without a separate driver.

First, since a separate driver performing a pre-emphasis function does not need to be provided, capacitance can be decreased. Therefore, it is possible to improve impedance characteristics.

Second, since a separate driver does not need to be provided, a driver forming area can be decreased. Therefore, it is possible to increase a layout margin.

What is claimed is:

1. A circuit for controlling a driver of a semiconductor memory apparatus, comprising:
   a driving unit having an impedance that is set according to a code value;
   a driving reinforcing control unit configured to output an adjustment code for a predetermined time; and
   a driving reinforcing unit configured to output a reinforcing code obtained by adjusting the code value using the adjustment code, wherein the reinforcing code reinforces a driving capability of the driving unit.

2. The circuit of claim 1,
wherein the driving reinforcing control unit comprises:
   a timing control unit configured to enable a code output enable signal for a time set by a timing data, and
   an adjustment code output unit configured to output the adjustment code according to offset data at an enable time of the code output enable signal.

3. The circuit of claim 2,
wherein the timing data and the offset data are set in a mode register.

4. The circuit of claim 2,
wherein the timing control unit comprises:
   a timing signal generator configured to generate timing signals generated with a time difference corresponding to a predetermined unit of time;
   a multiplexer configured to output one of the timing signals outputted by the timing signal generator according to the timing data; and
   a code output enable signal generator configured to generate the code output enable signal using the timing signal outputted by the multiplexer.

5. The circuit of claim 4,
wherein the timing signal generator comprises a plurality of delay elements, wherein each delay element has an output and is configured to delay a DLL clock by a predetermined unit of time and output a delayed DLL clock.

6. The circuit of claim 1,
wherein the driving reinforcing unit comprises an adder configured to add the adjustment code to the code value and output the reinforcing code.

7. A circuit for controlling a driver of a semiconductor memory apparatus of claim 1, further comprising:
   a data processing unit configured to output data to the driving unit according to the reinforcing code, and
   a driver control unit configured to output or intercept the reinforcing code according to a driver enable signal.

8. The circuit of claim 7,
wherein the driver control unit comprises:
   a data converting unit configured to convert data so as to enable pull-up and pull-down driving;
   a pull-up driver control unit configured to determine whether to output a first reinforcing code according to the driver enable signal; and
   a pull-down driver control unit configured to determine whether to output a second reinforcing code according to the driver enable signal.

9. The circuit of claim 8,
wherein the data converting unit is configured to invert pull-up data and pull-down data respectively, and output inverted pull-up data and inverted pull-down data.

10. The circuit of claim 8,
wherein the data processing unit comprises:
   a pull-up data processing unit configured to output an inverted pull-up data to the driving unit according to the first reinforcing code; and
   a pull-down data processing unit configured to output an inverted pull-down data to the driving unit according to the inverted second reinforcing code.

* * * * *